United States Patent
Itoh et al.

(10) Patent No.: US 6,168,962 B1
(45) Date of Patent: Jan. 2, 2001

(54) METHOD OF MANUFACTURING A SEMICONDUCTOR LIGHT EMITTING DEVICE

(75) Inventors: Norikazu Itoh; Shunji Nakata; Yukio Shakuda; Masayuki Sonobe; Tsuyoshi Tsutsui, all of Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/012,193

(22) Filed: Jan. 23, 1998

(30) Foreign Application Priority Data

Jan. 24, 1997 (JP) .................................................. 9-011220

(51) Int. Cl.$^7$ ................................................. H01L 21/302
(52) U.S. Cl. ................................. 438/22; 438/39; 438/46; 438/462
(58) Field of Search ................................ 438/22, 28, 33, 438/42, 46, 47, 460, 462, 977, 34

(56) References Cited

U.S. PATENT DOCUMENTS

| | | | |
|---|---|---|---|
| 5,418,190 | * | 5/1995 | Cholewa et al. ........................ 438/33 |
| 5,814,532 | * | 9/1998 | Ichihara ................................. 438/33 |
| 5,814,533 | * | 9/1998 | Shakuda ................................. 438/46 |
| 5,858,808 | * | 1/1999 | Igel et al. .............................. 438/465 |
| 5,904,548 | * | 5/1999 | Orcutt .................................. 438/462 |
| 5,939,735 | * | 8/1999 | Tsutui et al. ............................ 457/98 |

* cited by examiner

Primary Examiner—Savitri Mulpuri
(74) Attorney, Agent, or Firm—Arent Fox Kintner Plotkin Kahn

(57) ABSTRACT

Disclosed is a method of manufacturing a semiconductor light emitting device. Semiconductor overlying layers are formed on a substrate in a state of a wafer so that a light emitting area is provided therein. The semiconductor overlying layers includes first and second conductivity type layers. Part of the semiconductor overlying layers including the first conductivity type layer on a surface thereof is removed so as to expose part of the second conductivity type layer. Electrodes are formed, for each chip, respectively in connection with the surface of the first conductivity type layer and the surface of the exposed second conductivity type layer. The wafer is divided into individual chips. The exposed areas of the second conductivity type semiconductor layer is provided only part of a peripheral area of the chip so that the first conductivity type semiconductor layer is directly separated during dividing the wafer into individual chips. With such a method, when dividing a wafer into chips, the inefficiency of the space (etched areas do not contribute to light emission) is eliminated in etch-removing the semiconductor overlying layers at areas to be divided, thereby improving chip yield and hence reducing cost.

6 Claims, 3 Drawing Sheets

METHOD OF MANUFACTURING A SEMICONDUCTOR LIGHT EMITTING DEVICE

BACKGROUND OF THE INVENTION

This invention relates generally to a method of manufacturing a semiconductor light emitting device having semiconductor layers, including p-type and n-type layers, formed on a substrate to have a p-side electrode and an n-side electrode on the main surface side of the substrate. More particularly, this invention relates to a method of manufacturing a semiconductor light emitting device adapted to improve the chip yield, i.e. the number of semiconductor light emitting chips available upon breaking a wafer from the backside thereof into chips, such as in wafer breakage for bluish-light semiconductor light emitting devices having gallium-nitride based compound semiconductor layers formed on a sapphire substrate.

The conventional semiconductor light emitting device for emitting bluish light has a chip (hereinafter referred to as "LED chip") structure, for example, as shown in FIG. 4. That is, the LED chip includes a sapphire substrate 21 on which an n-type layer (cladding layer) 23 is formed by epitaxially growing an n-type GaN, for example. On the n-type layer 23, an active layer (light emitting layer) 24, e.g. of InGaN-based compound semiconductor having a band-gap energy lower than that of the cladding layer to define an emission light wavelength, wherein the "InGaN-based" means a chemical composition having In and Ga in a ratio to be varied. On the active layer 24, a p-type layer (cladding layer) 25 is formed, for example, of p-type GaN. The semiconductor layers has a p-side (upper) electrode 28 on a surface thereof and an n-side (lower) electrode 29 on a surface of the n-type layer 23 exposed by partly etching the semiconductor overlying layers. Incidentally, the n-type layer 23 and the p-type layer 25, in many cases, have respective AlGaN-based compound semiconductor layers on the active layer sides in order to improve carrier confining effects, wherein the "AlGaN-based" means a chemical composition having Al and Ga in a ratio to be varied.

For forming the LED chips, semiconductor layers are first formed on a surface of a sapphire substrate wafer. Then, the semiconductor layers thus formed are partly removed away by etching into a pattern that the type layer 23 is exposed at electrode forming areas as well as chip peripheral areas and the p-type layer is left at areas other than these areas. After forming electrodes 28, 29, the wafer is subjected to slicing from the backside thereof so as to be broken along cutting lines S, as shown in the figure, into separate chips. In this manner, the etch pattern for exposing the n-type layer 23 is in a form that the p-type layer 25 is removed at chip peripheral areas as shown in FIG. 5 so that the wafer is broken there into individual chips. This is because of the following reasons. That is, since the wafer of this kind is difficult to cleave, the semiconductor layers are reduced in thickness at areas where braking is performed. Moreover, if an unetched area is left at an end area of the n-type layer 23 for providing the n-type electrode 29 and if the position of breaking deviates from the normal position, the conductor wire thereafter bonded possibly leads to electric shorting. This should be avoided. In addition, cracks tend to occur in the active layer, as the situation of wafer breaking may be.

However, if the semiconductor layers are etched at chip peripheral areas to expose the n-type layer as stated above, the etch width B has to be determined to approximately 30 $\mu$m as taking into consideration deviation in slicing for carrying out wafer breaking. In such a case, if the resulting chip is in a square form having a side dimension A of approximately 360 $\mu$m, then the percentage of the area defined by the width B provided, for each chip, between the chips with respect to the effective chip area accounts for ($\{A \times B + (A+B) \times B\}/A \times A$) accounts for as high as approximately 17%. To this end, if the etch areas are provided for wafer breaking around the chips, the chip yield from the wafer is greatly reduced, thus raising a problem of mounting up of cost.

SUMMARY OF THE INVENTION

It is a primary object of the present invention to improve chip yield by eliminating the useless space in the semiconductor layer formed on a wafer that is removed away by etching to divide the wafer into chips, thereby reducing manufacture cost.

It is another object of the present invention to provide a method of manufacturing a semiconductor light emitting device wherein improvement is made for the chip pattern so that, even if the breaking position deviates, there is almost no fear of remaining a p-type layer left unetched at end areas of an n-type layer exposed for providing an n-side electrode.

In accordance with the present invention, there is provided a method of manufacturing a semiconductor light emitting device comprising the steps of:

forming semiconductor overlying layers on a substrate in a state of a wafer for providing a plurality of chips, the semiconductor overlying layers including first and second conductivity type layers;

removing part of the semiconductor overlying layers including the first conductivity type layer on a surface thereof so as to expose part of the second conductivity type layer;

forming, for each chip, electrodes respectively in connection with the surface of the first conductivity type layer and the surface of the exposed second conductivity type layer;

dividing the wafer into individual chips; and wherein the exposed areas of the second conductivity type semiconductor layer is provided only part of a peripheral area of the chip so that the first conductivity type semiconductor layer is directly separated during dividing the wafer into individual chips.

Here, the term "division (or dividing)" means separation of a wafer into chips involving by breaking, cleaving, dicing, and so forth.

This eliminates the necessity of providing the space for etch-removing, for dividing the wafer into chips, part of the semiconductor overlying layers at around the chip, thereby increasing the number of chips available from one wafer.

The chip may be rectangular in plan form, the exposed area of the second conductivity type semiconductor layer be formed at one corner area of the rectangular chip so that four adjacent rectangular chips have the exposed areas thereof formed continuous at bordering corners of the four adjacent chips. With such a method, even if the position of breaking deviates, there is no possibility that unetched area of the p-type layer is left at an end area of the exposed n-type layer, and no problem arises during wire bonding.

The substrate may be a sapphire substrate, and the semiconductor overlying layers being of a gallium-nitride based compound semiconductor, wherein slicing is performed from a surface side of the semiconductor overlying layers and thereafter slicing is made from a back side of the substrate to thereby carry out breaking. With such a method, breaking is further facilitated.

Here, the "gallium-nitride based compound semiconductor" refers to a semiconductor of a compound of Ga as a group-III element and N as a group-V element, wherein part the group-III element Ga may be substituted for other group-III elements such as Al and In and/or part the group-V element N may be substituted for other group-V elements such as P and As. Meanwhile, "slicing" means to form, by using a diamond pen or the like, a line or groove for performing breaking.

The above described objects and other objects, features, aspects and advantages of the present invention will become more apparent from the following detailed description of the present invention when taken in conjunction with the accompanying drawings.

DETAILED DESCRIPTION

Figure 1:
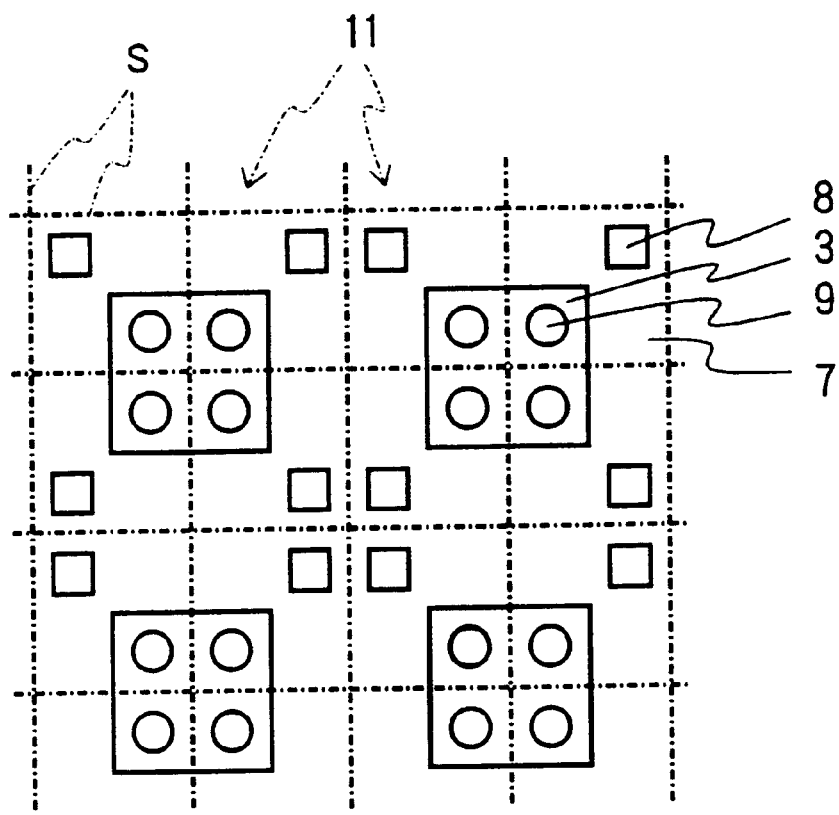
FIG. 1 is a plan explanatory view as one example of an LED chip pattern provided on a wafer for manufacturing semiconductor light emitting devices according to the method of the present invention.

Referring first to FIG. 1, there is illustrated a pattern for LED chips of a wafer in a state prior to division thereof into individual LED chips. That is, a method of manufacturing a semiconductor light emitting device according to the present invention includes a step of forming semiconductor overlying layers of a gallium-nitride based compound semiconductor suited for emitting bluish light on a sapphire substrate in a wafer. The etching on the semiconductor overlying layers is performed for exposing an n-type layer 3 at areas partly surrounding the LED chips 11, instead of the areas entirely surrounding the chips 11, thereby providing n-side electrodes 9. The chips of the wafer also have a p-type semiconductor layer and a current diffusing layer that are formed continuous to the LED chips 11 directly adjacent. Therefore, the division of the wafer (along dividing lines S) into individual chips 11 is directly carried out at areas where the unetched p-type layer and current limiting layer 7 exists.

Figure 2:
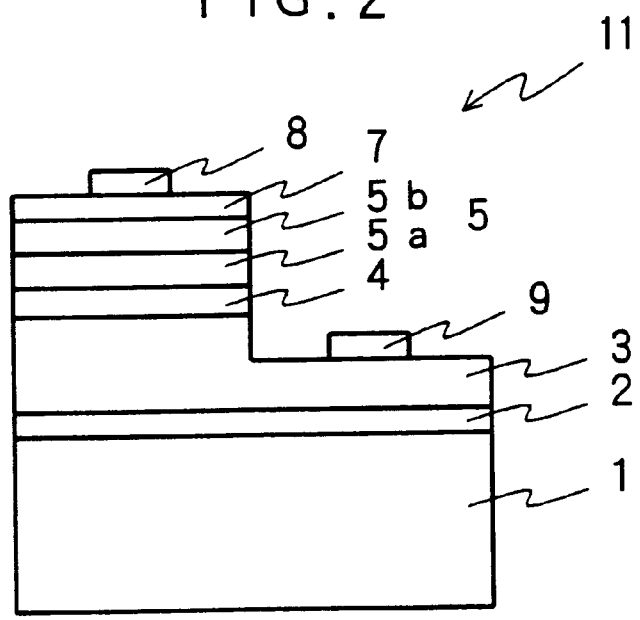
FIG. 2 is an explanatory sectional view, as one example, of the LED chip of FIG. 1.

The semiconductor overlying layers of the LED chip 11 has a structure as shown in an explanatory sectional view, as one example, of FIG. 2. That is, the semiconductor layers are formed by processing, for example, by a Metal-organic Chemical Vapor Deposition (MOCVD) method. A low-temperature buffer layer 2 of GaN is first deposited to a thickness of approximately 0.01–0.02 μm on the surface of a substrate 1 of, for example, a sapphire ($Al_2O_3$ single crystal). Then, an n-type layer 3 of n-type GaN is deposited to a thickness of approximately 1–5 μm on the low-temperature buffer layer 2. Further, an active layer 4 is formed of a material having a bandgap energy lower than that of the cladding layer, e.g. an InGaN-based compound semiconductor, to a thickness of approximately 0.05–0.3 (m on the n-type layer 3. Then, a p-type layer (cladding layer) 5 is formed to a thickness of approximately 0.2–1 μm, wherein the p-type layer is further formed by a p-type AlGaN-based compound semiconductor sublayer 5a and a GaN sublayer 5b. Thereafter, a current diffusion layer 7, such as a metal layer, is formed to a thickness of approximately 2–100 nm on the p-type layer 5, which is, for example, of a metal layer formed by evaporating and sintering Ni and Au for being alloyed.

In order to provide an n-side electrode 9, a photoresist layer is formed and patterned on the surface of the semiconductor overlying layers. Through the patterned photoresist, the current diffusion layer 7 and the semiconductor layers 3 to 5 are partly etched away so as to partly expose the n-type layer 3. This etching can be carried out by reactive ion etching using, for example, chlorine gas. In the present invention, the etching is carried out at areas not throughout around the LED chip 11, but limited to the areas for providing an n-side electrode 9 as shown, for example, in FIG. 1. That is, the etching area is limited only to part of the peripheral or surrounding area of the LED chip.

In the example of FIG. 1, the four rectangular LED chips 11 adjacently positioned are etched at their bordering corner areas such that their respective n-type layers 3 are exposed in a continuous manner. That is, the exposed n-type layers 3 of the four LED chips 11 are provided in a gathering manner. As a result, the division of the wafer is performed, in the later process, along a dividing line S passing through the center of these exposed n-type layers 3 in row and line directions, as shown in FIG. 1. In this manner, the wafer is divided into individual LED chips 11.

On the surface of the exposed n-type layer 3, the metals Ti and Al for providing an n-side electrode 9 are provided by vacuum evaporation, respectively, to a thickness of approximately 0.1 μm and a thickness of approximately 0.3 μm, followed by being sintered. Further, in order to provide a p-side electrode 8, a protective film, such as of SiN not shown, is partly removed away to vacuum-evaporate Ti and Au there. Thus, a p-side electrode 8 and an n-side electrode 9 are provided.

Thereafter, the wafer is divided along LED chip bordering portions. The wafer division into LED chips is carried out by first forming slicing lines or grooves as shown by the dividing lines S in FIG. 1 from the backside of the wafer with using a diamond pen or the like, and then applying a force to the slicing line from the wafer backside. Thus, the wafer is broken into individual LED chips 11. For this reason, the dividing lines S are formed so that they each pass through the center of the exposed n-type layers 3 and extend to the bordering portion to the adjacent LED chips 11 where the p-type layer and current diffusion layer 7 are left unetched.

Incidentally, the p-type layer 5 in the above-stated example was constituted by a double-layer structure having the GaN layer and the AlGaN-based compound semiconductor layer, because such an Al-contained layer preferably enhances carrier confining effects. However, the p-type layer 5 may be constituted by only the GaN layer. The n-type layer 3, on the other hand, may be formed by a double-layer structure having an AlGaN-based compound semiconductor layer combined therewith. Alternatively, the p-type layer 5 and/or the n-type layer 3 may be formed by a layer of other gallium-nitride compound semiconductor materials. Although the above example was of a double hetero structure having an active layer sandwiched between an n-type layer and a p-type layer, the semiconductor light emitting device may be of a p/n junction structure having a direct junction of an n-type layer and a p-type layer.

In the present invention, since no etching is carried out for the semiconductor layers at areas other than those for providing electrodes, there is no necessity of providing a gap pattern at areas between adjacent chips. It is therefore possible to form chips continuously in a desired size on a wafer. Consequently, there is increase in number of chips available from one wafer. For example, the dimension of the chip boundary can be reduced from 30 μm for the conventional case to approximately 5 μm, thus greatly reducing inefficient space on the wafer and hence contributing to reduction of manufacturing cost.

Furthermore, the exposed n-type layers 3 is formed at the adjacent corners of the four rectangular LED chips 11 as show in FIG. 1. There is almost no possibility that, even if the position of the dividing line S should deviate by a somewhat amount, the n-type layer 3 exposed for providing an n-side electrode 9 has at its bordering end an unetched portion of the p-type layer of the adjacent LED chip 11. As a result, there is no problem in wire bonding despite the exposed n-type layer is provided not entirely between the adjacent LED chips 11, i.e. not entirely surrounding the LED chip 11. If slicing lines or grooves are also formed on the main surface side of the semiconductor layers overlying the wafer in addition to the backside thereof, wafer breaking is further facilitated to reduce the occurrence of cracks within the semiconductor layers caused due to wafer breaking.

Figure 3:
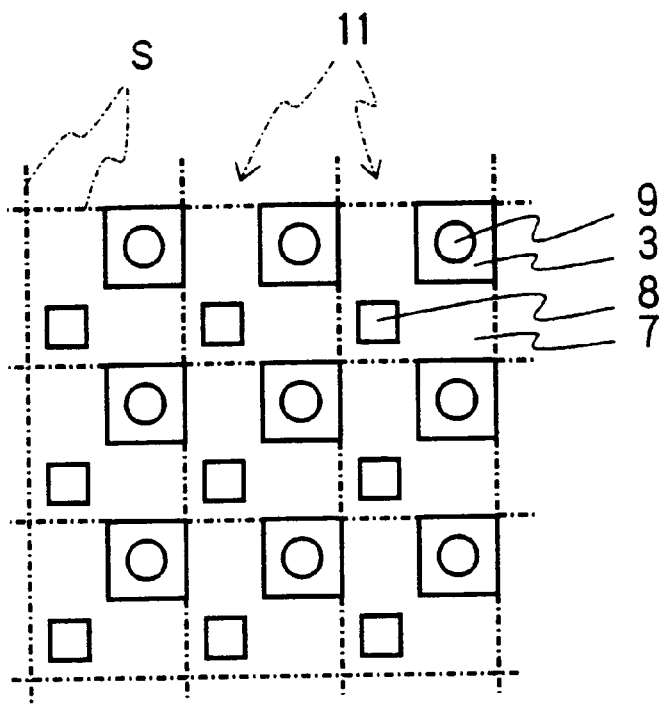
FIG. 3 is a explanatory plan view showing another example of an LED chip pattern formed on a wafer for manufacturing semiconductor light emitting devices according to the method of the present invention.
Figure 4:
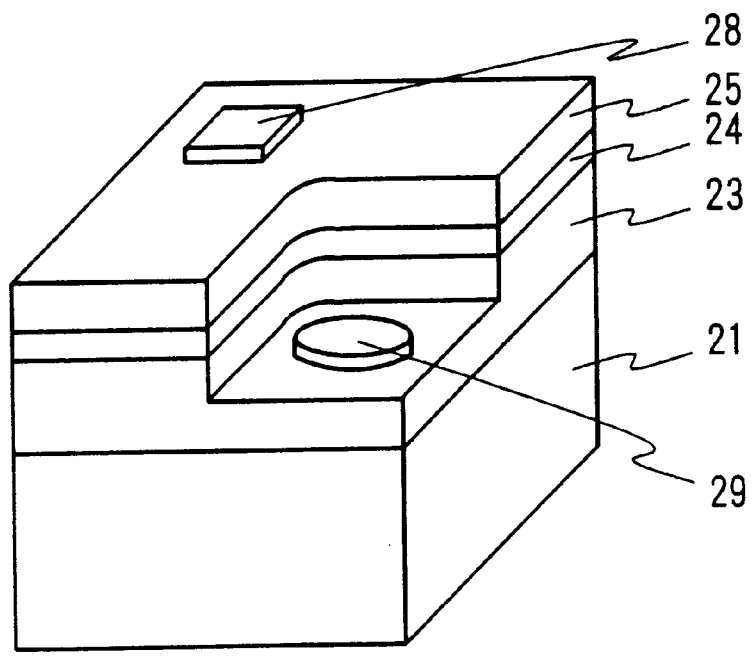
FIG. 4 is a perspective explanatory view of a conventional semiconductor light emitting device.
Figure 5:
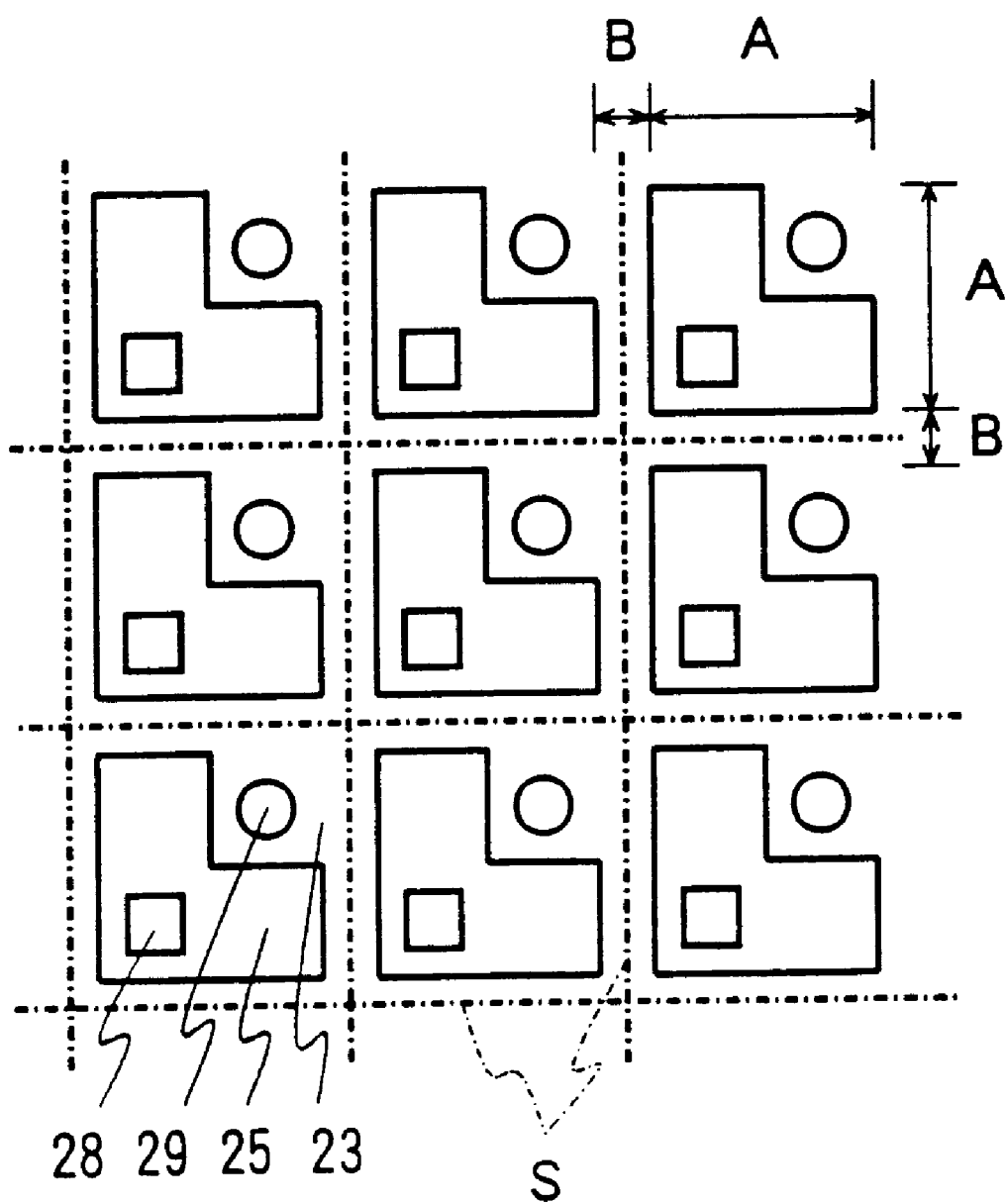
FIG. 5 is an explanatory plan view showing an example of an LED chip Pattern formed on a wafer for manufacturing semiconductor eight emitting devices according to a conventional method.

Thus, the problem of positional deviation with respect to the dividing line S can be eliminated as stated above by providing the etch-exposed n-type layer 3 at the corners of the adjacent four LED chips 11. However, as shown in FIG. 3, it is also possible to form exposed areas of the n-type layer 3 with respect to a given direction of the LED chips 11 in the conventional manner, and wherein the pattern of the LED chips 11 is continuous without providing a gap pattern between the LED chips 11. Although, in such a case, there is necessity of performing wafer division in a manner such that no positional deviation occurs relative to the dividing lines S, the slicing made from the semiconductor layer surface side as stated above enables accurate wafer division with the surface slicing line aligned with the backside slicing line S. By doing so, there is no possibility that the p-type layer 3 is left at the end of the exposed n-type layer 3 for an n-side electrode 9. As a result, there are no inefficient use of spaces between the LED chips, hence improving chip yield.

According to the present invention, it is possible to provide a larger number of same-sized LED chips from one wafer, contributing to reducing manufacturing cost. Moreover, since the etch areas for forming electrodes are provided at the corner area of the adjacent LED chips, the positional deviation of breaking, if occurs, gives rise to no problems. Therefore, inexpensive semiconductor light emitting devices are available with simplified processes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor light emitting device comprising the steps of:

forming semiconductor overlying layers on a substrate in a state of a wafer for providing a plurality of chips, said semiconductor overlying layers including first and second conductivity type layers;

removing part of said semiconductor overlying layers including said first conductivity type layer on a surface thereof so as to expose part of said second conductivity type layer;

forming, for each chip, electrodes respectively in connection with the surface of said first conductivity type layer and the surface of said exposed second conductivity type layer; and dividing said wafer into individual chips, wherein the exposed area of said second conductivity type semiconductor layer of each chip is provided only on a part of a peripheral area of the chip so that said first conductivity type semiconductor layer is directly separated during dividing said wafer into individual chips without providing a gap pattern at areas between adjacent chips.

2. A method of manufacturing a semiconductor light emitting device according to claim 1, wherein the chip is rectangular in plan form, the exposed area of said second conductivity type semiconductor layer is formed at one corner area of the rectangular chip so that four adjacent retangular chips have the exposed areas thereof formed continuous at bordering corners of the four adjacent chips.

3. A method of manufacturing a semiconductor light emitting device according to claim 1, wherein said substrate is a sapphire substrate, and said semiconductor overlying layers being of a gallium-nitride based compound semiconductor, wherein slicing is performed from a surface side of said semiconductor overlying layers and thereafter slicing is made from a back side of said substrate to thereby carry out breaking.

4. A method of manufacturing a semiconductor light emitting device according to claim 3, wherein etching is made on part of said semiconductor overlying layers to a pattern directed in a same direction for each chip.

5. A method of manufacturing a semiconductor light emitting device according to claim 1, wherein a sapphire substrate is employed for said substrate, and said semiconductor overlying layers is formed by an overlying structure of a gallium-nitride based compound semiconductor having an n-type layer, an active layer, and a p-type layer.

6. A method of manufacturing a semiconductor light emitting device according to claim 5, wherein slicing lines for division into chips are formed in the back surface of said sapphire substrate, and said sapphire substrate being divided into chips by applying a force to a slicing line area.

* * * * *